US008780536B2

(12) United States Patent
Yen et al.

(10) Patent No.: US 8,780,536 B2
(45) Date of Patent: Jul. 15, 2014

(54) MOTHERBOARD CAPABLE OF REDUCING ELECTROMAGNETIC INTERFERENCE

(75) Inventors: Shin-Ting Yen, New Taipei (TW); Yung-Chieh Chen, New Taipei (TW); Duen-Yi Ho, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 272 days.

(21) Appl. No.: 13/275,329

(22) Filed: Oct. 18, 2011

(65) Prior Publication Data

US 2013/0016466 A1 Jan. 17, 2013

(30) Foreign Application Priority Data

Jul. 15, 2011 (TW) ............................ 100125040 A

(51) Int. Cl.
*H05K 5/00* (2006.01)
*H05K 7/00* (2006.01)

(52) U.S. Cl.
USPC ............ 361/679.01; 361/679.31; 361/679.32; 361/760; 361/785; 174/262

(58) Field of Classification Search
CPC ......... G11C 5/025; G06F 1/183; G06F 1/184; G06F 1/185; G06F 1/186; H05K 1/14; H05K 1/141; H05K 1/142; H05K 1/144; H05K 1/145; H05K 1/11; H05K 1/111; H05K 1/112; H05K 1/114; H05K 1/115; H05K 1/0296; H05K 1/0298; H05K 2201/10; H05K 2201/10159; H05K 2201/10189; H05K 7/1429; H05K 7/1417; H05K 7/1422
USPC ................ 174/260–262; 361/679.01, 679.31, 361/679.32, 760, 767, 768, 783, 785
See application file for complete search history.

(56) References Cited

U.S. PATENT DOCUMENTS

| | | | | |
|---|---|---|---|---|
| 6,295,565 | B1 * | 9/2001 | Lee | 710/301 |
| 7,019,983 | B2 * | 3/2006 | Record et al. | 361/760 |
| 7,154,759 | B2 * | 12/2006 | Kwon | 361/782 |
| 2002/0075637 | A1 * | 6/2002 | Caselli et al. | 361/683 |
| 2002/0196650 | A1 * | 12/2002 | Chang | 365/63 |

* cited by examiner

*Primary Examiner* — Hoa C Nguyen
(74) *Attorney, Agent, or Firm* — Novak Druce Connolly Bove + Quigg LLP

(57) ABSTRACT

A motherboard includes a printed circuit board (PCB), a central processing unit (CPU), a regulator, a first memory adaptor, and a second memory adaptor. The PCB includes a top surface, a bottom surface, a plurality of first soldering pads and first leads arranged on the top surface, and a plurality of second leads arranged between the top surface and the bottom surface. The PCB defines a plurality of first vias, second vias, and power vias. The CPU is connected to the first vias. The voltage regulator is connected to the power vias. The first memory adaptor neighbors to the regulator and is surface-mount soldered to the first soldering pads. The first soldering pads are connected to the first vias by first leads. The second memory adaptor is soldered to the second vias. The second vias are connected to the first vias by the second leads.

6 Claims, 6 Drawing Sheets

MOTHERBOARD CAPABLE OF REDUCING ELECTROMAGNETIC INTERFERENCE

BACKGROUND

1. Technical Field

The present disclosure relates to motherboards, and particularly, to a motherboard capable of reducing electromagnetic interference.

2. Description of Related Art

FIG. 1 shows a cross-sectional view of a motherboard 90, which includes a printed circuit board (PCB) 91, a central processing unit (CPU) 92, a plurality of memory adaptors 93, and a voltage regulator 94 mounted on the PCB 91. The PCB 91 includes a top surface 911 and a bottom surface 912 and defines a plurality of first signal vias 913, second signal vias 914, and power vias 915. The CPU 92 is soldered to the top surface 911 and connected to the first signal vias 913. Each of the memory adaptors 93 is soldered to the top surface 911 and connected to the second signal vias 914. The first signal vias 913 are connected to the second signal vias 914 by leads 916 arranged between the top surface 911 and the bottom surface 912, thus the CPU 92 can exchange signals with the memory adaptors 93. One of the memory adaptors 93 is in a position neighboring the voltage regulator 94. The voltage regulator 94 is connected to the power vias 915 and supplies power to each of memory adaptors 93. The power passes through the power vias 915 and generates electromagnetic fields that surround the power vias 915. The second signal vias 914 which closely neighbor the power vias 915 suffer interference from the electromagnetic fields and may generate their own electric field. Signals transmitted between the CPU 92 and the memory adaptor 93 neighboring the voltage regulator 94 may suffer interference from these electric fields.

Therefore, it is desirable to provide a disclosure, which can overcome the limitations described.

BRIEF DESCRIPTION OF THE DRAWINGS

Many aspects of the present disclosure can be better understood with reference to the drawings. The components in the drawings are not necessarily drawn to scale, the emphasis instead being placed upon clearly illustrating the principles of the present disclosure. Moreover, in the drawings, like reference numerals designate parts throughout the views.

DETAILED DESCRIPTION

Embodiments of the present disclosure will be described in detail with reference to the drawings.

Figure 1:
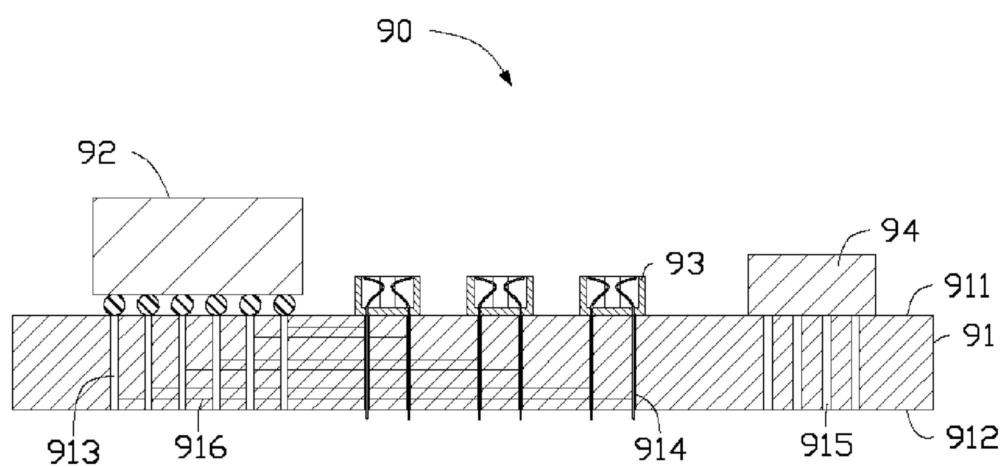
FIG. 1 is a cross-sectional view of a motherboard.
Figure 2:
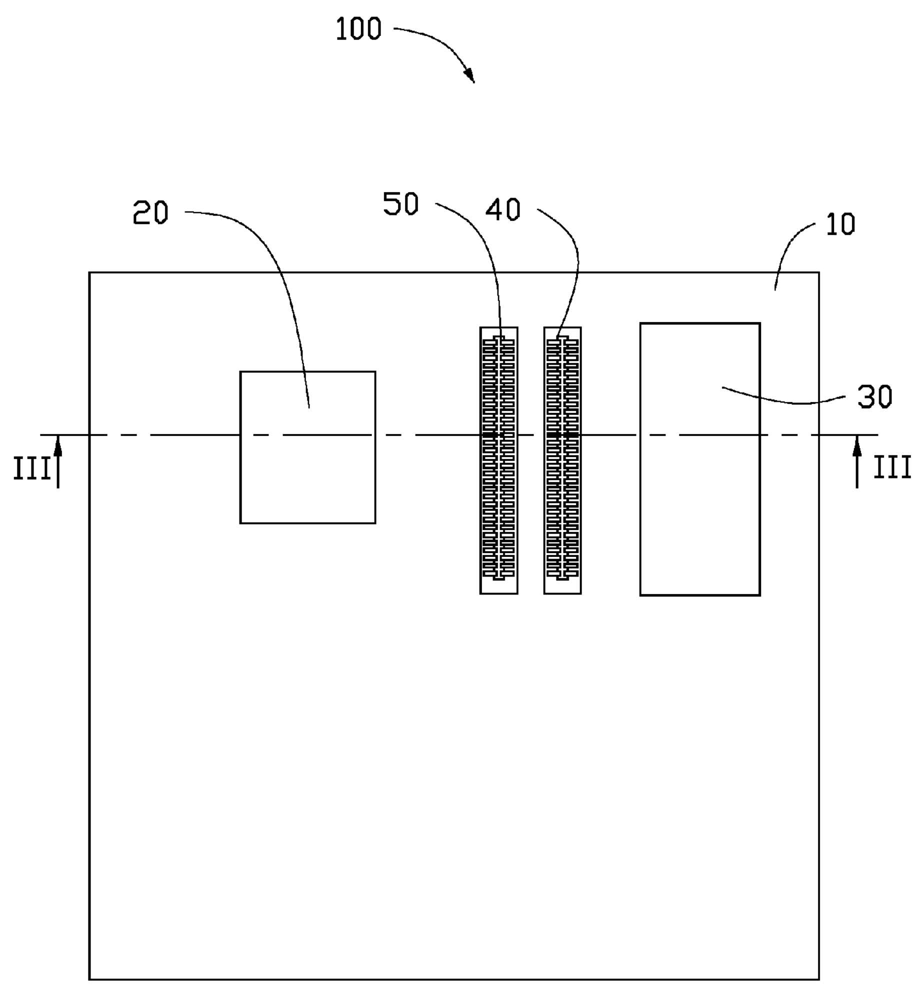
FIG. 2 is a top view of a motherboard in accordance with a first embodiment of the present disclosure.
Figure 3:
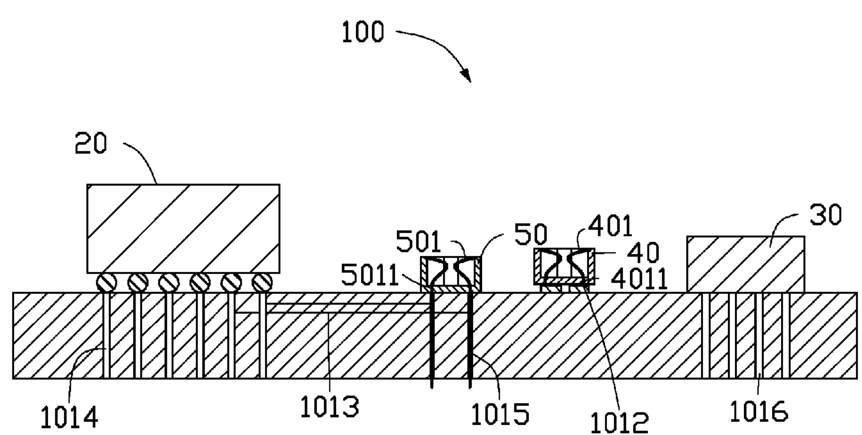
FIG. 3 is a cross-sectional view of the motherboard taken along a line III-III of FIG. 2.
Figure 4:
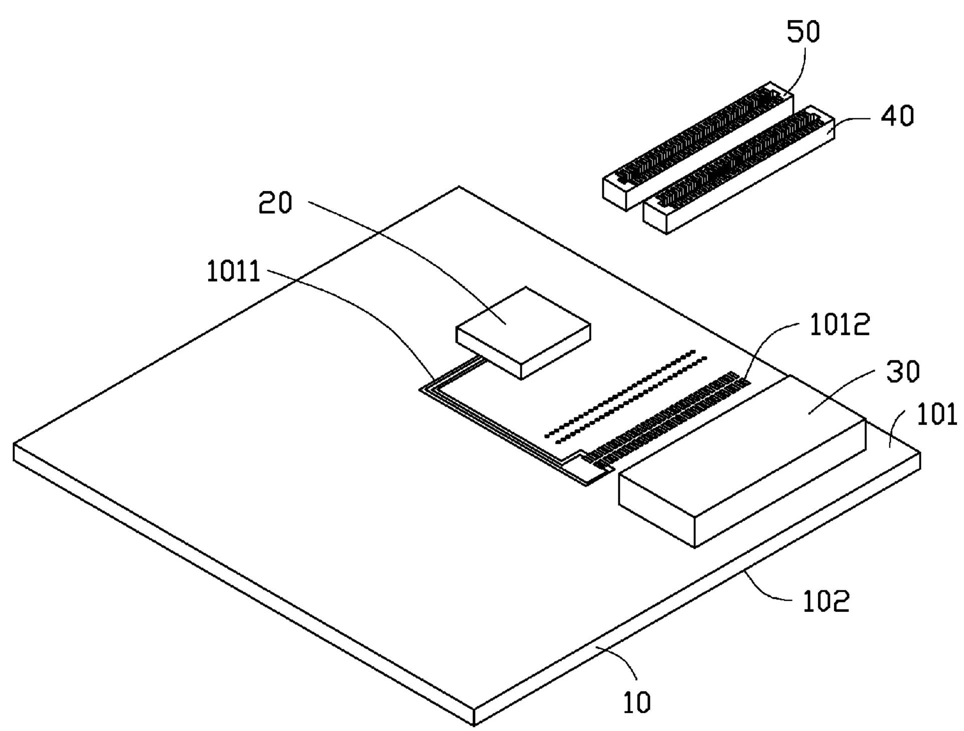
FIG. 4 is an isometric view of the motherboard of FIG. 2.

Referring to FIGS. 2 to 4, a motherboard 100, according to a first embodiment, is shown. The motherboard 100 includes a PCB 10, a CPU 20, a voltage regulator 30, and a first memory adaptor 40 and a second adaptor 50.

The PCB 10 includes a top surface 101 and a bottom surface 102 opposite to the top surface 101, a plurality of first leads 1011 arranged on the top surface 101, a plurality of first soldering pads 1012 arranged on the top surface 101, and a plurality of second leads 1013 arranged between the top surface 101 and the bottom surface 102. The PCB 10 also defines a plurality of first vias 1014, a plurality of second vias 1015, and a plurality of power vias 1016 perpendicular to the top surface 101 and the bottom surface 102. The first soldering pads 1012 are connected to the first vias 1014 through the first leads 1011. The second vias 1015 are connected to the first vias 1014 through the second leads 1013.

The CPU 20 is above the first vias 1014 and soldered to the first vias 1014 on the top surface 101. The CPU 20 is configured for exchanging signals with the first memory adaptor 40 and with the second memory adaptor 50.

The voltage regulator 30 is above the power vias 1016 connected to the power vias 1016 on the top surface 101.

The first memory adaptor 40 and the second memory adaptor 50 are mounted on the top surface 101 in parallel and each is configured for receiving a memory module (not shown). The first memory adaptor 40 is positioned neighboring to the voltage regulator 30. The first memory adaptor 40 includes a plurality of first terminals 401. Each first terminal 401 includes a generally flat first soldering portion 4011. Each first soldering portion 4011 is surface-mount soldered to a first soldering pad 1012.

The second memory adaptor 50 is separated from the voltage regulator 30 by the first memory adaptor 40. The second memory adaptor 50 includes a plurality of second terminals 501. Each second terminal 501 includes a generally stitch-like soldering leg 5011. Each soldering leg 5011 is received and soldered in a second via 1015.

In use, the voltage regulator 30 supplies power to the first memory adaptor 40 and the second memory adaptor 50 through the power vias 1016. The CPU 20 respectively exchanges signals with the first memory adaptor 40 through the first leads 1011, and with the second memory adaptor 50 through the second leads 1013. The power passing through the power vias 1016 generates a surrounding electromagnetic field. The first memory adaptor 40, surface-mount soldered to the PCB 10, experiences a reduction in electromagnetic interference caused by the electromagnetic field of the transmissions between the CPU 20 and the first memory adaptor 40.

Figure 5:
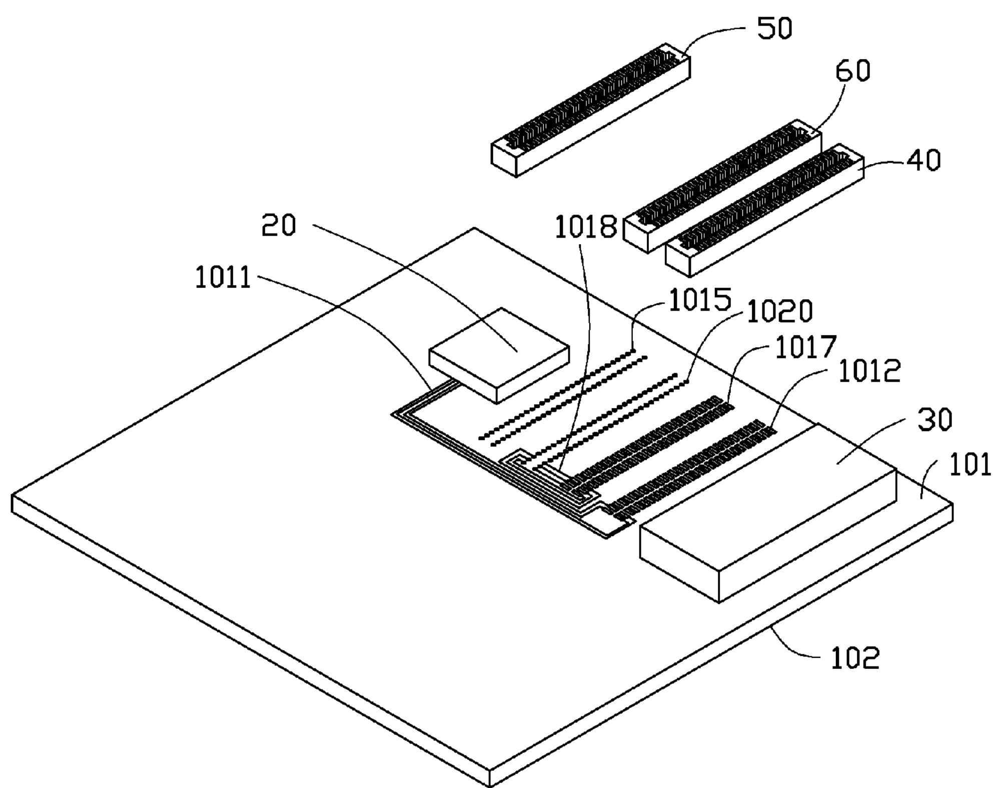
FIG. 5 is an isometric view of a motherboard in accordance with a second embodiment of the present disclosure.
Figure 6:
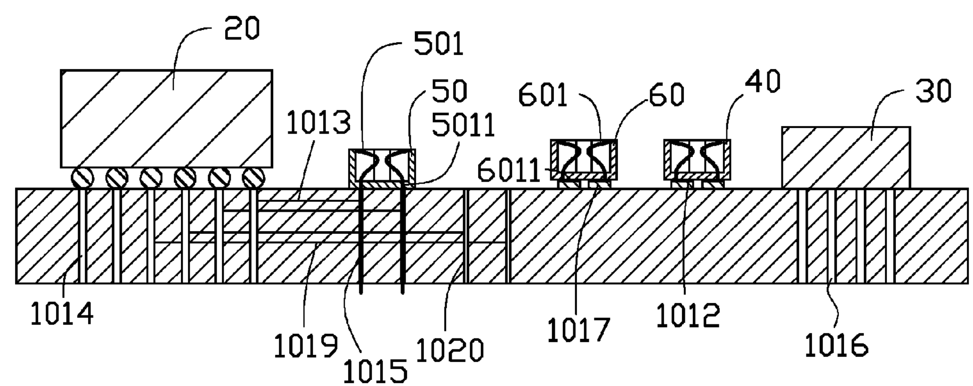
FIG. 6 is a cross-sectional view of the motherboard of FIG. 5.

Referring to FIGS. 5 and 6, a motherboard 100 according to a second embodiment is shown. The motherboard 100 includes a PCB 10, a CPU 20, a voltage regulator 30, a first memory adaptor 40, a second memory adaptor 50, and a third memory adaptor 60.

In this embodiment, the motherboard 100 further includes a plurality of second soldering pads 1017 arranged on the top surface 101, a plurality of third leads 1018 arranged on the top surface 101, and a plurality of fourth leads 1019 arranged between the top surface 101 and the bottom surface 102 of the PCB 10. The PCB 10 further defines a plurality of third vias 1020 perpendicular to the top surface 101 and the bottom surface 102. The third vias 1020 are arranged between the second vias 1015 and the second soldering pads 1017. The second soldering pads 1017 are connected to the third vias 1020 through the third leads 1018. The third vias 1020 are connected to the first vias 1014 through the fourth leads 1019.

The first memory adaptor 40 is positioned neighboring the voltage regulator 30 and includes a plurality of first terminals 401 each of which has a generally flat first soldering portion 4011. Each first soldering portion 4011 is surface-mount soldered to a first soldering pad 1012.

The second memory adaptor 50 is separated from the voltage regulator 30 by the first memory adaptor 40 and includes a plurality of second terminals 501 each of which has a generally stitch-like soldering leg 5011. Each soldering leg 5011 is received and soldered to a second via 1015.

The third memory adaptor 60 is arranged between the first memory adaptor 40 and the second memory adaptor 50. The third memory adaptor 60 includes a plurality of third terminals 601. Each third terminal 601 includes a generally flat second soldering portion 6011. Each second soldering portion 6011 is surface-mount soldered to a second soldering pad 1017. The third vias 1020 are arranged between the second memory adaptor 50 and the third adaptor 60.

The first memory adaptor 40 and the third memory adaptor 60 are surface-mount soldered to the PCB 10, thus any electromagnetic interference generated by the electromagnetic field around the signals exchanged between the CPU 20 and the first memory adaptor 40 and the third memory 60 can be reduced.

The number of memory adaptors in this disclosure is not limited. On the motherboard 100 a memory adaptor positioned neighboring to the voltage regulator 30 must be surface-mount soldered to the PCB 10.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the scope of the disclosure but do not restrict the scope of the disclosure.

What is claimed is:

1. A motherboard, comprising:

a printed circuit board comprising:

a top surface;

a bottom surface opposite to the top surface;

a plurality of first soldering pads and first leads arranged on the top surface; and a plurality of second leads arranged between the top surface and the bottom surface;

the printed circuit board defining a plurality of first vias, a plurality of second vias, and a plurality power vias perpendicular to the top surface;

a central processing unit mounted on the top surface above the first vias and connected to the first vias;

a voltage regulator mounted on the top surface above the power vias and connected to the power vias;

a first memory adaptor neighboring the voltage regulator and surface-mount soldered to the first soldering pad, the first soldering pads being connected to the first vias by the first leads; and a second memory adaptor separated from the voltage regulator by the first memory adaptor, the second memory adaptor being mounted on the top surface and soldered to the second vias, the second vias being connected to the first vias by the second leads.

2. The motherboard of claim 1, wherein the motherboard further comprises a third memory adaptor arranged between the first memory adaptor and the second memory adaptor, the third adaptor surface-mount soldered to the top surface.

3. The motherboard of claim 2, wherein the printed circuit board further comprises a plurality of second soldering pads and third leads arranged on the top surface, the printed circuit board further defines a plurality of third vias perpendicular to the top surface; the third memory adaptor is mounted to the second soldering pads, the third vias are arranged between the second memory adaptor and the third memory adaptor and connected to the second pads by the third leads.

4. The motherboard of claim 3, wherein the printed circuit board further comprises a plurality of fourth leads arranged between the top surface and the bottom surface; the third vias are connected the first vias by the fourth leads.

5. The motherboard of claim 1, wherein the second memory adaptor comprises a plurality of soldering legs, each soldering leg is received and soldered in a second via.

6. The motherboard of claim 1, wherein the voltage regulator is configured for supplying power to the first memory adaptor and the second memory adaptor.

* * * * *